US008526220B2

(12) United States Patent
Cai et al.

(10) Patent No.: US 8,526,220 B2
(45) Date of Patent: Sep. 3, 2013

(54) COMPLEMENTARY SOI LATERAL BIPOLAR FOR SRAM IN A LOW-VOLTAGE CMOS PLATFORM

(75) Inventors: Jin Cai, Cortlandt Manor, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 13/158,420

(22) Filed: Jun. 12, 2011

(65) Prior Publication Data

US 2012/0314485 A1 Dec. 13, 2012

(51) Int. Cl.
*G11C 11/00* (2006.01)

(52) U.S. Cl.
USPC ........... 365/156; 365/154; 365/177; 365/205; 365/207; 257/156; 438/311

(58) Field of Classification Search
USPC ......... 365/156, 154, 177, 205, 207; 257/257; 438/311
See application file for complete search history.

(56) References Cited

U.S. PATENT DOCUMENTS

| 3,197,710 A | 7/1965 | Lin | 330/307 |
| 4,999,518 A | 3/1991 | Dhong et al. | 326/109 |
| 5,289,409 A * | 2/1994 | Reinschmidt | 365/154 |
| 5,298,786 A | 3/1994 | Shahidi et al. | 257/559 |
| 5,453,636 A * | 9/1995 | Eitan et al. | 257/378 |
| 5,583,059 A | 12/1996 | Burghartz | 438/319 |
| 6,091,654 A * | 7/2000 | Forbes et al. | 365/208 |
| 6,340,612 B1 | 1/2002 | Noble et al. | 438/213 |
| 6,738,294 B2 * | 5/2004 | Layman et al. | 365/189.011 |
| 6,812,545 B2 | 11/2004 | Dunn et al. | 257/565 |
| 2011/0299327 A1 * | 12/2011 | Asa | 365/156 |

OTHER PUBLICATIONS

U.S. Appl. No. 12/958,647, filed Dec. 2, 2010 (not yet published).
T. C. Chen et al., "Lateral Bipolar Transistor With Elevated Base Contact," IBM Tech. Discl. Bull., Nov. 1989, pp. 157-159.
S. Parke et al., "A Versatile, SOI BiCMOS Technology with Complementary Lateral BJT's," IEDM, 1992, pp. 453-456.
M. Rodder, et al., "Silicon-on-Insulator Bipolar Transistors," IEEE Electron Device Letters, vol. EDL-4, No. 6, 1983, pp. 193-195.
J. C. Sturm, et al., "A Lateral Silicon-on-Insulator Bipolar Transistor with a Self-Aligned Base Contact," IEEE Electron Device Letters, vol. EDL-8, No. 3, 1987, pp. 104-106.

* cited by examiner

*Primary Examiner* — Connie Yoha
(74) *Attorney, Agent, or Firm* — Ido Tuchman; Louis J. Percello (57) ABSTRACT

An example embodiment is a memory cell including a SOI substrate. A first and second set of lateral bipolar transistors are fabricated on the SOI substrate. The first and second set of lateral bipolar transistors are electrically coupled to form two inverters. The inverters are cross coupled to form a memory element.

20 Claims, 7 Drawing Sheets

COMPLEMENTARY SOI LATERAL BIPOLAR FOR SRAM IN A LOW-VOLTAGE CMOS PLATFORM

BACKGROUND

The present invention is directed toward semiconductor circuits, and more particularly to complementary semiconductor-on-insulator lateral bipolar SRAM circuits and methods for fabrication such circuits.

Digital logic has been dominated by silicon complementary metal-oxide-semiconductor (CMOS) circuits. However, it is becoming increasingly difficult to fabricate CMOS circuitry that meets technology's demand for ever smaller devices that operate using less power. For example, the performance of static random access memory (SRAM) implemented in CMOS is reaching a limit due to its poor signal-to-noise margins at low operating voltages (i.e., less than 0.5 V).

Using bipolar transistors to construct SRAM cells offers lower standby power and large static noise margin. However, conventional vertical bipolar transistors are generally not suitable for high density digital logic because of their large footprint due to isolation structure, and their large parasitic capacitance due to minority carrier charge storage.

SUMMARY

One example of the invention is a memory cell comprising semiconductor-on-insulator (SOI) substrate. A first set of lateral bipolar transistors are fabricated on the SOI substrate. The first set of lateral bipolar transistors form a first inverter having a first output terminal configured to invert a first input signal at a first input terminal. A second set of lateral bipolar transistors is also fabricated on the SOI substrate. The second set of lateral bipolar transistors form a second inverter having a second output terminal configured to invert a second input signal at a second input terminal. The first inverter is cross coupled to the second inverter such that the first input terminal is electrically coupled to the second output terminal and the second input terminal is electrically coupled to the first output terminal.

Another example of the invention is a method for fabricating a memory cell. The method includes depositing a SOI substrate and constructing a first set of lateral bipolar transistors on the SOI substrate. A coupling step couples the first set of lateral bipolar transistors to form a first inverter having a first output terminal configured to invert a first input signal at a first input terminal. The method further includes constructing a second set of lateral bipolar transistors on the SOI substrate and coupling the second set of lateral bipolar transistors to form a second inverter having a second output terminal configured to invert a second input signal at a second input terminal. Another coupling step cross couples the first inverter to the second inverter such that the first input terminal is electrically coupled to the second output terminal and the second input terminal is electrically coupled to the first output terminal.

Yet a further example of the invention is a memory array. The memory array includes an SOI substrate and a plurality of memory cells. Each of the memory cells includes a first set of lateral bipolar transistors are fabricated on the SOI substrate. The first set of lateral bipolar transistors form a first inverter having a first output terminal configured to invert a first input signal at a first input terminal. A second set of lateral bipolar transistors are also fabricated on the SOI substrate. The second set of lateral bipolar transistors form a second inverter having a second output terminal configured to invert a second input signal at a second input terminal. The first inverter is cross coupled to the second inverter such that the first input terminal is electrically coupled to the second output terminal and the second input terminal is electrically coupled to the first output terminal.

DETAILED DESCRIPTION

The present invention is described with reference to embodiments of the invention. Throughout the description of the invention reference is made to FIGS. 1-7. When referring to the figures, like structures and elements shown throughout are indicated with like reference numerals.

Figure 1:
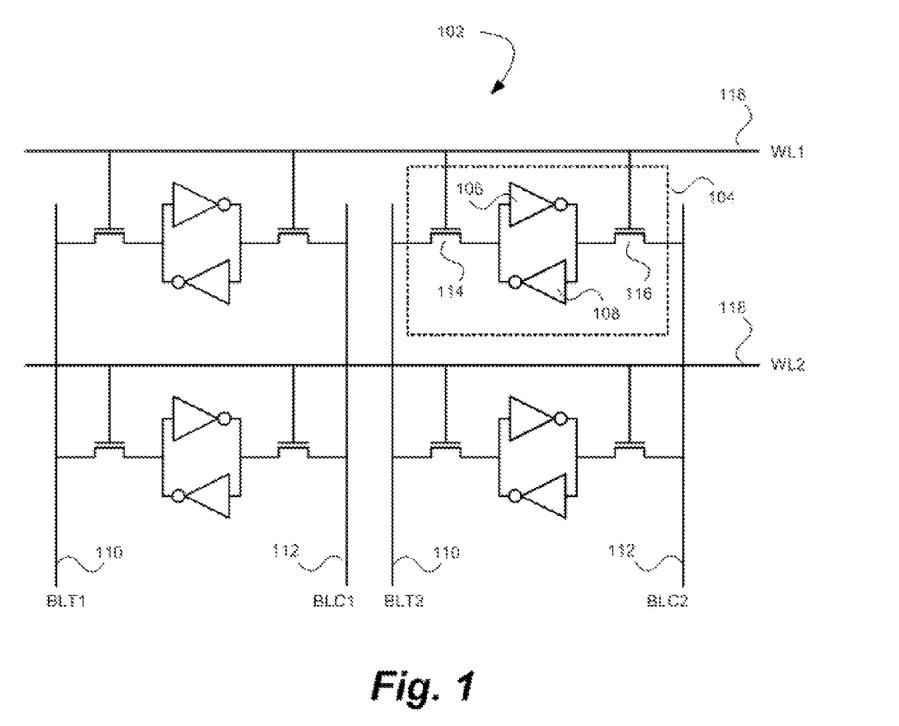
FIG. 1 shows an example embodiment of a memory array contemplated by the present invention.

FIG. 1 shows an example embodiment of a memory array 102 contemplated by the present invention. The memory array 102 includes a plurality of memory cells 104 fabricated on a semiconductor-on-insulator (SOI) substrate. As described in more detail below, each of the memory cells includes a first set of lateral bipolar transistors fabricated on the SOI substrate and a second set of lateral bipolar transistors fabricated on the SOI substrate.

The first set of lateral bipolar transistors is configured to form a first inverter 106. The first inverter is configured to invert an input signal at its input terminal. For example, the first inverter outputs a logic "0" signal at its output terminal if a logic "1" signal is presented at the input terminal. Furthermore, the first inverter outputs a logic "1" signal at its output terminal if a logic "0" signal is presented at the input terminal.

The second set of lateral bipolar transistors is configured to form a second inverter 108. The second inverter is configured to invert an input signal at its input terminal as well. In addition, the first inverter 106 is cross coupled to the second inverter 108 such that the first inverter's input terminal is electrically coupled to the second inverter's output terminal and the second inverter's input terminal is electrically coupled to the first inverter's output terminal. In this arrangement, the cross-coupled inverters act as memory elements. Each memory element can store a logic state. For example, a memory element may store a logic state in which the first inverter outputs a logic "1", and another memory element may store a logic state in which the first inverter outputs a logic "0".

The memory array 102 also includes a plurality of bit line true (BLT) 110 lines and bit line complement (BLC) lines 112. Each of the memory cells 104 comprises a first access transistor 114 controlling electrical impedance from the first inverter 106 to one of the BLT lines 110, and a second access transistor 116 controlling electrical impedance from the second inverter 108 to one of the BLC lines 112. The memory array 102 also includes a plurality of word lines 118. Each of the access transistors 114 and 116 include a gate terminal coupled to one of the word lines 118.

To write or program a memory cell 104 in the memory array 102, the BLT 110 and BLC 112 lines for the column containing the memory cell 104 are set to a desired logic value to be stored. The word line 118 corresponding to the memory cell 104 is then set so that the access transistors 114 and 116 are activated. This forces the memory cell 104 to overwrite its current logic value with the new logic value present on the BLT 110 and BLC 112 lines.

To read a memory cell 104 in the memory array 102, the word line 118 corresponding to the memory cell 104 is set so that the access transistors 114 and 116 are activated. Sense amplifiers coupled to the memory cell's BLT 110 and BLC 112 lines are then used to detect the logic value stored in the memory cell 104.

During standby, the power supply voltage $V_{DD}$ across the memory element can be lowered to lower the standby power dissipation of the memory element. For example, during standby, $V_{DD}$ may be lowered to 0.5 Volts or lower. The bistable memory element consisting of two cross-coupled complementary SOI lateral bipolar inverters advantageously has significantly better noise margin than a CMOS counterpart. Also, when operated at low voltages, such as 0.5 Volts or lower, the bipolar memory element has much smaller standby power dissipation than the CMOS counterpart.

Figure 2:
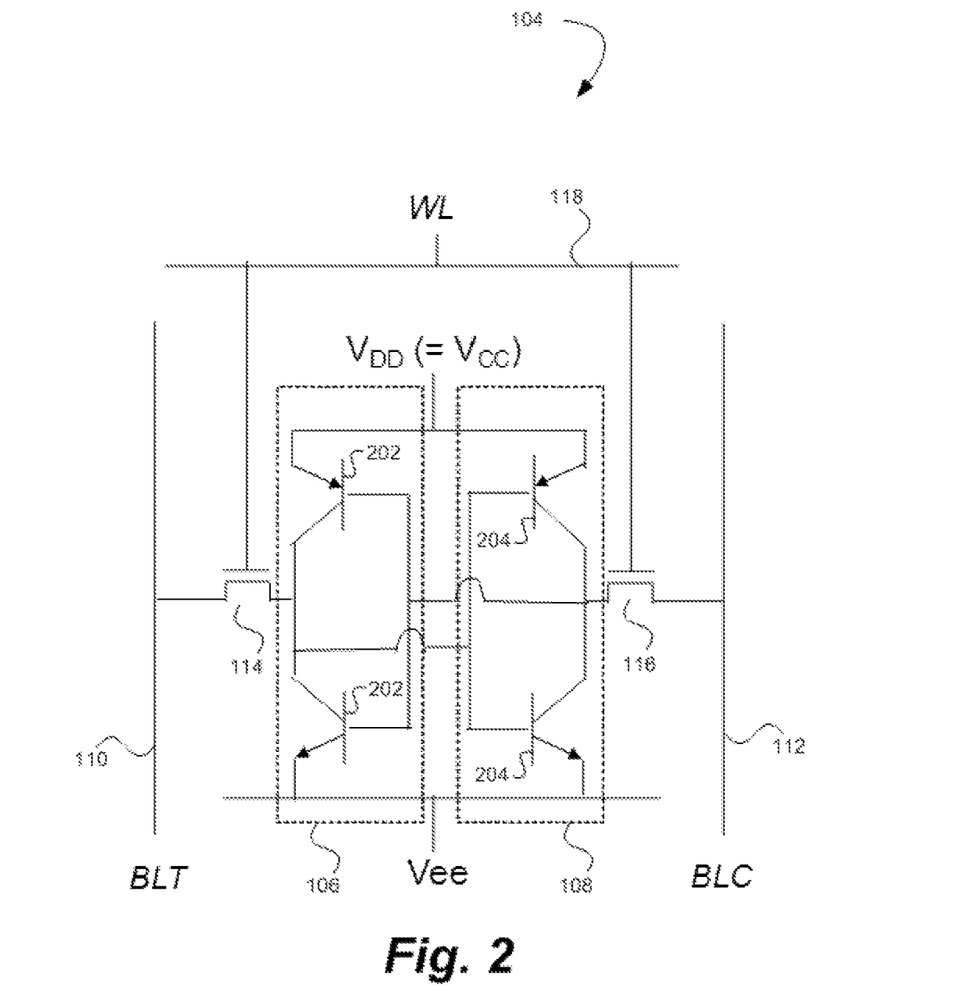
FIG. 2 shows an example embodiment of a memory cell contemplated by the present invention.

Turning to FIG. 2, an example memory cell 104 contemplated by the present invention is shown. The memory cell 104 includes a first set of lateral bipolar transistors 202 fabricated on the SOI substrate and a second set of lateral bipolar transistors 204 fabricated on the SOI substrate. As discussed above, the first set of lateral bipolar transistors 202 is configured to form a first inverter 106 and the second set of lateral bipolar transistors 204 is configured to form a second inverter 108. Furthermore, the first inverter 106 is cross coupled to the second inverter 108 such that the first input terminal is electrically coupled to the second output terminal and the second input terminal is electrically coupled to the first output terminal.

The memory cell 104 includes a first access transistor 114 controlling electrical impedance from the first inverter 106 to a BLT 110. A second access transistor 116 controls electrical impedance from the second inverter 108 to BLC 112. In one embodiment, the first and second access transistors 114 and 116 are field effect transistors (FETs). For example, the first and second access transistors 114 and 116 may be n-channel FETs or p-channel FETs. The discussion below is for the case of n-channel FETs used as access transistors. Additionally, the first and second access transistors 114 and 116 include a gate terminal coupled to a word line 118.

In standby mode, the voltage at $V_{DD}$ is lowered (e.g., 0.5 Volts) to take advantage of the memory element's noise margin characteristics. Furthermore, $V_{EE}$ is set to 0 Volts. The wordline 118 is also set to 0 Volts, thereby turning off the access transistors 114 and 116.

During a memory write operation, $V_{EE}$ is set to 0 Volts. BLT 110 is set to the desired binary value to be stored. Likewise, BLC 112 is set to the complement of the desired binary value to be stored. The wordline 118 is then raised to $V_{DD}$ so that the memory cell 104 is overwritten with the desired binary value.

During a memory read operation, $V_{EE}$ is pulled negative to avoid read disturb. In other words, the inverter circuits 106 and 108 must carry enough current to supply the FET current to maintain memory cell stability. In general, the larger the voltage difference between $V_{CC}$ and $V_{EE}$, the more current the bipolar inventors can supply. Next, the word line 118 corresponding to the memory cell 104 is set so that the access transistors 114 and 116 are activated. Sense amplifiers coupled to the memory cell's BLT 110 and BLC 112 lines are then used to detect the logic value stored in the memory cell 104.

Figure 3:
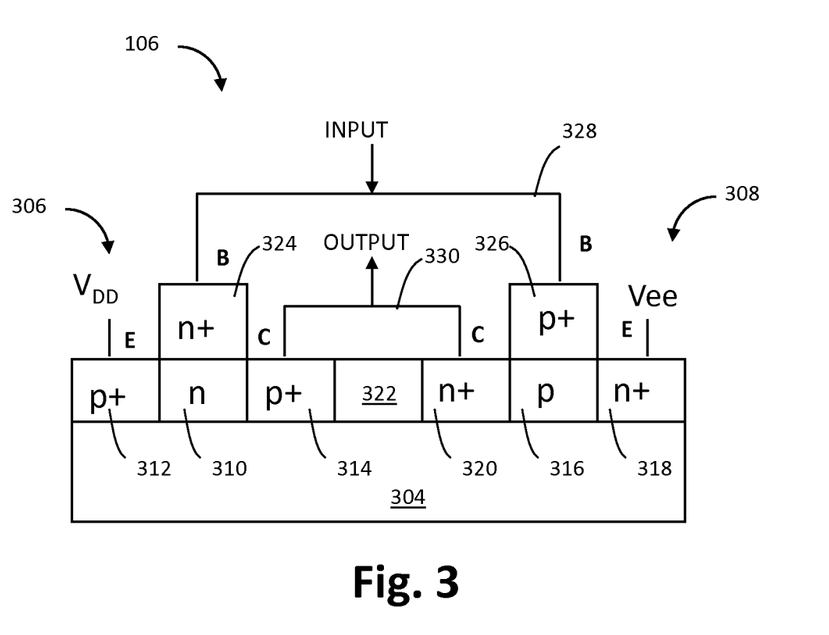
FIG. 3 shows an example embodiment of a complementary transistor inverter circuit contemplated by the present invention.

FIG. 3 shows an example embodiment of a complementary transistor inverter circuit 106 contemplated by the present invention. The inverter circuit 106 includes a semiconductor-on-insulator (SOI) substrate. In a particular embodiment, the SOI wafer used has a silicon thickness between 10 nm to 100 nm, and a buried insulator thickness between 20 nm to 200 nm. The inverter circuit 106 further includes a lateral PNP bipolar transistor 306 and a lateral NPN bipolar transistor 308 fabricated on the SOI substrate 304. The lateral PNP bipolar transistor 306 and the NPN bipolar transistor 308 may be separated by a shallow insulation trench 322 made from dielectric material.

The lateral PNP bipolar transistor 306 includes a PNP base 310 between a PNP emitter 312 and a PNP collector 314. The PNP base 310 is an n-type semiconductor region and the PNP emitter 312 and the PNP collector 314 are heavily-doped p-type semiconductor regions separated by the PNP base 310. As used herein, heavy doping means introducing more than one dopant atom per one-hundred thousand atoms of silicon. The lateral PNP bipolar transistor 306 also includes a PNP extrinsic base region 324 abutting the PNP base 310. The PNP extrinsic base region 324 is a heavily-doped n-type semiconductor region. Furthermore, the PNP base, the PNP emitter, and the PNP collector abut the buried insulator of the SOI substrate.

The lateral NPN bipolar transistor 308 includes a NPN base 316 between a NPN emitter 318 and a NPN collector 320. The NPN base 316 is a p-type semiconductor region and the NPN emitter 318 and the NPN collector 320 are heavily-doped n-type semiconductor regions separated by the NPN base 316. The lateral NPN bipolar transistor 308 also includes a NPN extrinsic base region 326 abutting the NPN base 316. The NPN extrinsic base region 326 is a heavily-doped p-type semiconductor region. Furthermore, the NPN base 316, the NPN emitter 318, and the NPN collector 320 abut the buried insulator of the SOI substrate.

The inverter circuit 106 includes an input terminal 328 electrically coupled to the NPN extrinsic base region 326 and the PNP extrinsic base region 324. Additionally, an output terminal 330 is electrically coupled to the NPN collector 320 and the PNP collector 314. The inverter circuit 106 is powered with a power voltage line $V_{DD}$ electrically coupled to the PNP emitter 312 and a voltage line Vee electrically coupled to the NPN emitter 318. The PNP base 310 and the NPN base 316 may be fabricated from silicon or silicon-germanium alloy.

Figure 4:
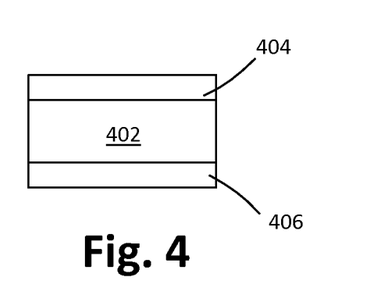
FIG. 4 shows an example of a PNP base and a NPN base with a middle region between a top region and a bottom region.

With reference to FIG. 4, the PNP base 310 and the NPN base 316 may include a middle region 402 between a top region 404 and a bottom region 406. The base is configured so that the middle region 402 has a smaller band gap than the top region 404 and the bottom region 406. For a detailed discussion of a transistor base with a middle region 402 between a top region 404 and a bottom region 406, the reader is referred to U.S. patent application Ser. No. 12/958,647 filed Dec. 2, 2010, titled "SOI SiGe-BASE LATERAL BIPOLAR JUNCTION TRANSISTOR" and incorporated herein in its entirety by reference.

FIGS. 5A-5F show steps for fabricating a complementary transistor inverter circuit. The method includes fabricating a lateral PNP transistor on a silicon-on-insulator substrate, fabricating a lateral NPN transistor on the silicon-on-insulator substrate, and electrically coupling the lateral PNP transistor and the lateral NPN transistor to form an inverter.

Figure 5A:
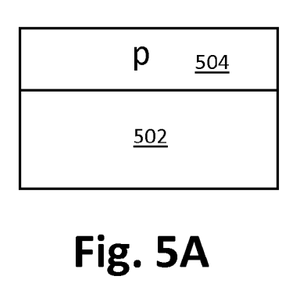
FIGS. 5A-5F illustrate one example method for fabricating a complementary transistor inverter circuit.

At FIG. 5A, the method includes providing a silicon-on-insulator 502 (SOI) wafer as a starting substrate. The silicon thickness may be, for example, between 10 nm to 100 nm, and buried insulator thickness between 20 nm to 200 nm. Shallow trench isolation may be used to define active silicon device areas. This step may include removing a silicon layer between active silicon device areas, filling the trench with oxide and polishing the wafer to form a planar surface. At least one NPN transistor and PNP transistor device areas are defined during the trench isolation step.

Next, a masked implant step is used to dope the silicon p-type to about $1 \times 10^{18}$ parts/cm$^3$ to $1 \times 10^{19}$/cm$^3$ in the NPN device areas 504. Another implanting step dopes the silicon n-type to about similar concentration in the PNP device areas.

Figure 5B:
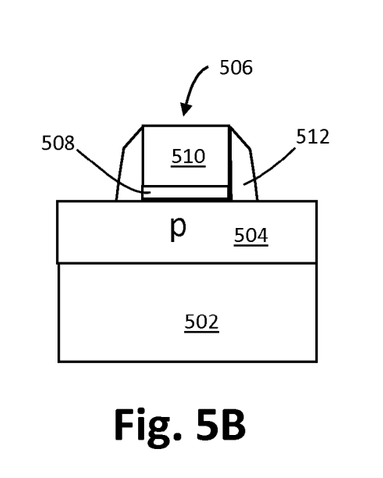

Next, at FIG. 5B, a dummy gate stack 506 is formed (to be removed later). The dummy gate stack 506 includes a dielectric layer 508 and a polysilicon layer 510. The total gate stack height can be between 50 nm to 200 nm. The dummy gate stack can be taller than the silicon thickness to facilitate the self-aligned implant.

After creating the dummy gate stack 506, the polysilicon layer and the dielectric layer are etched selective to the underlying silicon layer 504. In addition, sidewall spacers 512 are formed by depositing a dielectric layer (e.g., nitride) followed by an etch back.

Figure 5C:
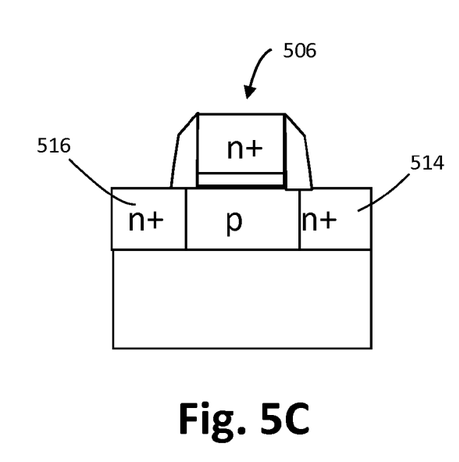

At FIG. 5C, a self-aligned implant is performed to form heavily doped emitter 514 and collector 516 regions using the dummy gate stack 506 as an implant mask. The NPN transistor is doped n-type and the PNP transistor doped p-type. The doping concentration may be in the range of $5 \times 10^{19}$ parts/cm$^3$ to $5 \times 10^{20}$ parts/cm$^3$.

Figure 5D:
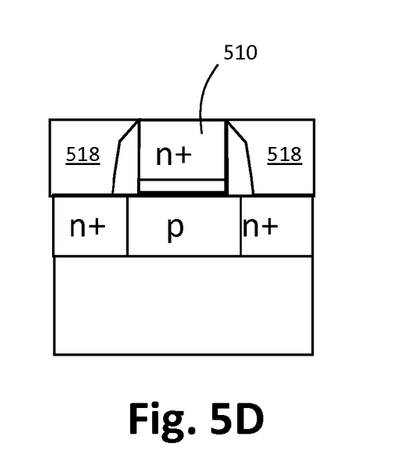

Next, at FIG. 5D, a dielectric layer 518 (e.g., oxide) is deposited. This is followed by polish back to form a planar surface with the polysilicon layer 510 of the gate stack.

Figure 5E:
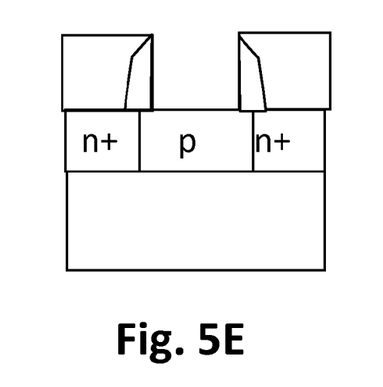

At FIG. 5E, the dummy gate is removed. This process includes etching away the exposed polysilicon layer and then the underlying dielectric layer in both the NPN and PNP transistor device areas.

Figure 5F:
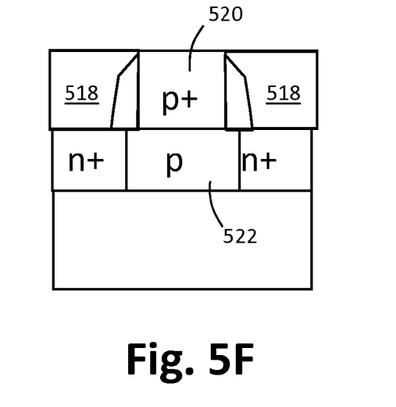

At FIG. 5F, the gate trench is refilled with polysilicon 520. This step is followed by polish back to form a planar surface with the dielectric layer 518. The polysilicon layer 520 is doped by masked implant; p-type doping for the NPN transistor and n-type doping for the PNP transistor. The doped polysilicon layer 520 acts as the extrinsic base for contacting the intrinsic base layer 522 underneath.

The inverter fabrication undergoes further processing, such as removing the dielectric layer outside the gate material while keeping the spacer intact. The process may additionally add a spacer layer before a self-aligned silicidation process. Next, a self-aligned silicidation, metalization and contact process is performed to wire the NPN and PNP transistors to form the complementary lateral SOI bipolar inverter.

One advantage of the replacement gate process flow described above is that the sacrificial dielectric layer under the polysilicon gate is used as an etch stopper for the gate stack etch process to prevent any recess in the emitter and collector areas. Furthermore, the replacement gate process is generally compatible with the conventional CMOS fabrication process.

Alternatively, a "gate first" process flow can be used in which the polysilicon layer is deposited directly on the silicon layer without the gate dielectric layer in between. In this flow, no dummy gate removal and polysilicon gate refill is needed.

However, the gate stack etch will also remove the top part of the silicon layer in the emitter and collector regions. The gate first process is generally compatible with the conventional CMOS fabrication process.

As mentioned above, the transistor bases may be fabricated from a silicon-germanium alloy. FIGS. 6A-6G show an example method for fabricating a complementary transistor inverter circuit using a silicon-germanium alloy for the transistor bases.

Figure 6A:
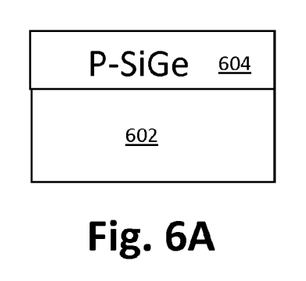
FIG. 6A-6G illustrate another example method for fabricating a complementary transistor inverter circuit.

At FIG. 6A, a silicon-germanium-on-insulator (SGOI) wafer 602 is provided as a starting substrate. In one embodiment, the SiGe layer thickness is between 10 to 100 nm, and buried insulator thickness between 20 nm to 200 nm. The SGOI wafer can be formed by depositing a germanium layer on a SOI wafer followed by a thermal mixing process. The germanium concentration can be approximately 20% to 30%.

The fabrication method may include performing a shallow trench isolation to define active device areas. This includes removing the silicon-germanium layer between active device areas, filling the trench with oxide and polishing back to form a planar surface. At least a NPN SiGe-base transistor and a PNP SiGe-base transistor device areas are defined during this step.

Next, a masked implant is used to dope the SiGe layer p-type 604. The doping may be about $1 \times 10^{18}$ parts/cm$^3$ to $1 \times 10^{19}$/cm$^3$ in the NPN device areas. Another implanting step dopes the SiGe layer n-type to about similar concentration in the PNP device areas.

Figure 6B:
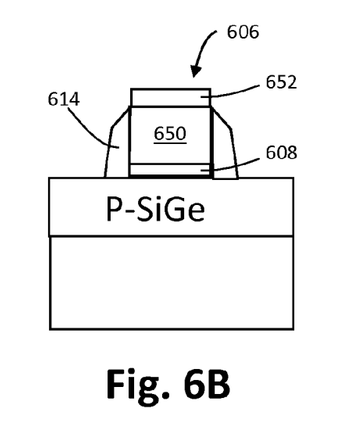

Next, at FIG. 6B, a dummy gate stack 606 is formed (to be removed later). The dummy gate stack 606 includes a top dielectric layer 608 (e.g., oxide), a polysilicon layer 650, and another bottom dielectric layer 652 (e.g., nitride). The total gate stack height can be between 50 nm to 200 nm. The dummy gate stack can be taller than the SiGe layer thickness to facilitate the self-aligned implant.

After creating the dummy gate stack 606, the top dielectric layer, the polysilicon layer and the bottom dielectric layer are etched selective to the underlying SiGe layer 604. In addition, sidewall spacers 614 are formed by depositing a dielectric layer (e.g., nitride) followed by an etch back.

Figure 6C:
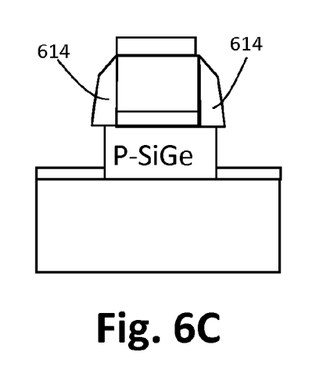

As shown in FIG. 6C, the SiGe layer is recessed in the emitter and collector areas. This leaves a 10 nm to 20 nm seed layer for subsequent epitaxial silicon growth.

Figure 6D:
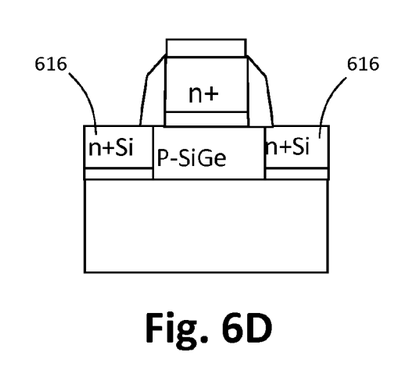

Next, at FIG. 6D, an epitaxy silicon layer 616 is selectively grown in the emitter and collector areas. In the dummy gate stack region, the top dielectric layer prevents silicon growth from the underlying polysilicon layer. The silicon layer 616 can be in-situ doped to n-type in the NPN transistor and p-type in the PNP transistor. Alternatively, the silicon layer 616 can be doped by self-aligned implant similarly to those in a Si-based bipolar inverter. With the in-situ doped process, a dielectric layer is needed to protect the PNP device region when the n-doped silicon is grown over the NPN transistor area, and vise versa. The doping concentration is in the range of $5 \times 10^{19}$ parts/cm$^3$ to $5 \times 10^{20}$ parts/cm$^3$.

Figure 6E:
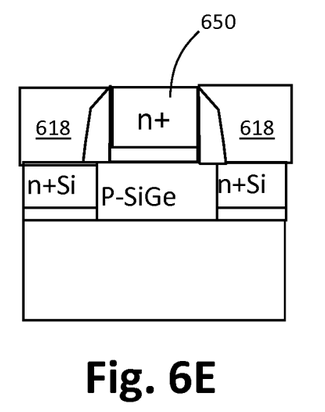

Next, at FIG. 6E, a dielectric layer 618 (e.g., oxide) is deposited. This is followed by polish back to form a planar surface with the polysilicon layer 650 of the gate stack.

Figure 6F:
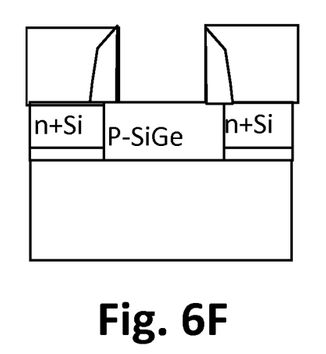

At FIG. 6F, the dummy gate is removed. This process includes etching away the exposed polysilicon layer and then the underlying dielectric layer in both the NPN and PNP transistor device areas.

Figure 6G:
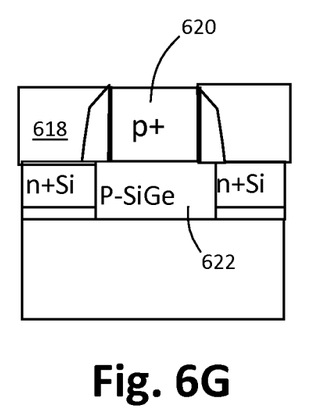

At FIG. 6G, the gate trench is refilled with polysilicon 620. This step is followed by polish back to form a planar surface with the dielectric layer 618. The polysilicon layer 620 is doped by masked implant; p-type doping for the NPN transistor and n-type doping for the PNP transistor. The doped polysilicon layer 620 acts as the extrinsic base for contacting the intrinsic base layer 622 underneath.

The inverter fabrication undergoes further processing, such as removing the dielectric layer outside the gate material while keeping the spacer intact. The process may additionally add a spacer layer before a self-aligned silicidation process. Next, a self-aligned silicidation, metalization and contact process is performed to wire the NPN and PNP transistors to form the complementary SiGe-base lateral SOI bipolar inverter.

Figure 7:
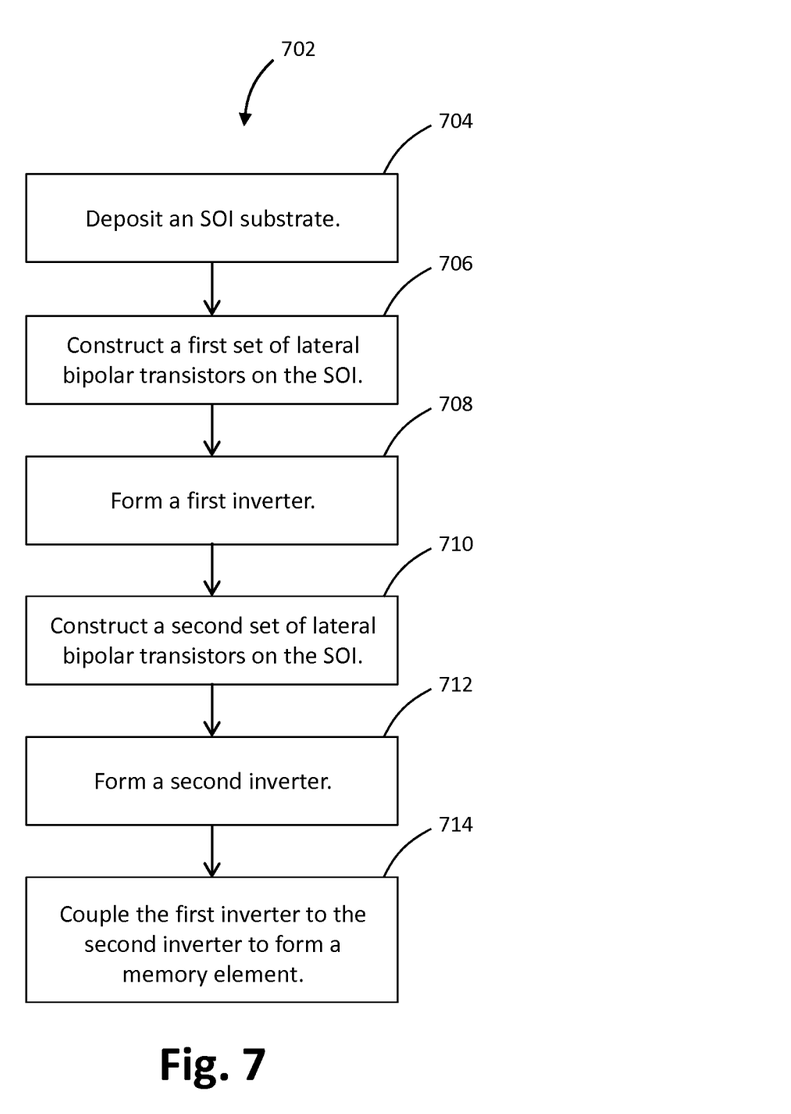
FIG. 7 shows a flowchart representing an example method for fabricating memory cell contemplated by the present invention.

FIG. 7 shows a flowchart representing an example method 702 for fabricating a memory cell contemplated by the present invention. The method includes a depositing step 704 to deposit a semiconductor-on-insulator (SOI) substrate.

Next, at constructing operation 706, a first set of lateral bipolar transistors are constructed on the SOI substrate. At coupling operation 708, the first set of lateral bipolar transistors are coupled to form a first inverter having a first output terminal configured to invert a first input signal at a first input terminal.

At constructing operation 710, a second set of lateral bipolar transistors are constructed on the SOI substrate. At coupling operation 712, the second set of lateral bipolar transistors are coupled to form a second inverter having a second output terminal configured to invert a second input signal at a second input terminal.

At cross coupling step 714, the first inverter is cross coupled to the second inverter such that the first input terminal is electrically coupled to the second output terminal and the second input terminal is electrically coupled to the first output terminal. This operation forms a memory element, as discussed above.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory cell comprising:
a semiconductor-on-insulator (SOI) substrate;
a first set of lateral bipolar transistors fabricated on the SOI substrate, the first set of lateral bipolar transistors forming a first inverter having a first output terminal configured to invert a first input signal at a first input terminal; and
a second set of lateral bipolar transistors fabricated on the SOI substrate, the second set of lateral bipolar transistors forming a second inverter having a second output terminal configured to invert a second input signal at a second input terminal;
wherein the first inverter is cross coupled to the second inverter such that the first input terminal is electrically coupled to the second output terminal and the second input terminal is electrically coupled to the first output terminal.

2. The memory cell of claim 1, further comprising:
a first access transistor controlling electrical impedance from the first inverter to a bit line true (BLT); and
a second access transistor controlling electrical impedance from the second inverter to a bit line complement (BLC).

3. The memory cell of claim 2, wherein the first and second access transistors are field effect transistors (FETs).

4. The memory cell of claim 3, wherein the first and second access transistors are n-channel FETs.

5. The memory cell of claim 3, wherein the first and second access transistors are p-channel FETs.

6. The memory cell of claim 2, wherein each of the first and second access transistors include a gate terminal coupled to a word line.

7. The memory cell of claim 2, wherein the first and second access transistors are used to write data to and read from the memory cell.

8. The memory cell of claim 1, wherein the first set of lateral bipolar transistors and the second set of lateral bipolar transistors each includes:
a lateral PNP bipolar transistor fabricated on the SOI substrate, the lateral PNP bipolar transistor including a PNP base, a PNP emitter, and a PNP collector; and
a lateral NPN bipolar transistor fabricated on the SOI substrate, the lateral NPN bipolar transistor including a NPN base, a NPN emitter, and a NPN collector.

9. A method for fabricating a memory cell, the method comprising:
depositing a semiconductor-on-insulator (SOI) substrate;
constructing a first set of lateral bipolar transistors on the SOI substrate;
coupling the first set of lateral bipolar transistors to form a first inverter having a first output terminal configured to invert a first input signal at a first input terminal;
constructing a second set of lateral bipolar transistors on the SOI substrate;
coupling the second set of lateral bipolar transistors to form a second inverter having a second output terminal configured to invert a second input signal at a second input terminal; and
cross coupling the first inverter to the second inverter such that the first input terminal is electrically coupled to the second output terminal and the second input terminal is electrically coupled to the first output terminal.

10. The method of claim 9, further comprising:
fabricating a first access transistor;
coupling the first access transistor to a bit line true (BLT) such that the first access transistor controls electrical impedance from the first inverter to the BLT;
fabricating a second access transistor; and
coupling the second access transistor to a bit line complement (BLC) such that the second access transistor controls electrical impedance from the second inverter to the BLC.

11. The method of claim 10, wherein the first and second access transistors are field effect transistors (FETs).

12. The method of claim 11, wherein the first and second access transistors are n-channel FETs.

13. The method of claim 11, wherein the first and second access transistors are p-channel FETs.

14. The method of claim 10, further comprising coupling each of the first and second access transistors to a word line.

15. The method of claim 9, wherein constructing the first set of lateral bipolar transistors and the second set of lateral bipolar transistors includes:
fabricating a lateral PNP transistor on the SOI substrate, the lateral PNP bipolar transistor including a PNP base, a PNP emitter, and a PNP collector;
fabricating a lateral NPN transistor on the SOI substrate, the lateral NPN bipolar transistor including a NPN base, a NPN emitter, and a NPN collector.

16. A memory array comprising:
a semiconductor-on-insulator (SOI) substrate; and
a plurality of memory cells, each of the memory cells including:
   a first set of lateral bipolar transistors fabricated on the SOI substrate, the first set of lateral bipolar transistors forming a first inverter having a first output terminal configured to invert a first input signal at a first input terminal; and
   a second set of lateral bipolar transistors fabricated on the SOI substrate, the second set of lateral bipolar transistors forming a second inverter having a second output terminal configured to invert a second input signal at a second input terminal;
   wherein the first inverter is cross coupled to the second inverter such that the first input terminal is electrically coupled to the second output terminal and the second input terminal is electrically coupled to the first output terminal.

17. The memory array of claim 16, further comprising:
a plurality of bit line true (BLT) lines; and
a plurality of bit line complement (BLC) lines; and
wherein each of the memory cells further includes:
   a first access transistor controlling electrical impedance from the first inverter to one of the BLT lines; and
   a second access transistor controlling electrical impedance from the second inverter to one of the BLC lines.

18. The memory array of claim 17, further comprising:
a plurality of word lines; and
wherein each of the first and second access transistors include a gate terminal coupled to one of the word lines.

19. The memory array of claim 17, wherein the first and second access transistors are p-channel field effect transistors (pFETs).

20. The memory array of claim 17, wherein the first and second access transistors are n-channel field effect transistors (nFETs).

* * * * *